US012628396B2

(12) United States Patent
Okita et al.

(10) Patent No.: US 12,628,396 B2
(45) Date of Patent: May 12, 2026

(54) SILICON CARBIDE SUBSTRATE AND METHOD OF MANUFACTURING SILICON CARBIDE SUBSTRATE

(71) Applicant: SUMITOMO ELECTRIC INDUSTRIES, LTD., Osaka (JP)

(72) Inventors: Kyoko Okita, Osaka (JP); Tsubasa Honke, Osaka (JP); Shunsaku Ueta, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 457 days.

(21) Appl. No.: 18/278,421

(22) PCT Filed: Nov. 24, 2021

(86) PCT No.: PCT/JP2021/042936
§ 371 (c)(1),
(2) Date: Aug. 23, 2023

(87) PCT Pub. No.: WO2022/190469
PCT Pub. Date: Sep. 15, 2022

(65) Prior Publication Data
US 2024/0136403 A1 Apr. 25, 2024
US 2024/0234509 A9 Jul. 11, 2024

(30) Foreign Application Priority Data
Mar. 12, 2021 (JP) ................................. 2021-039845

(51) Int. Cl.
*H10D 62/832* (2025.01)
*H01L 21/306* (2006.01)
*H10P 52/40* (2026.01)

(52) U.S. Cl.
CPC ....... *H10D 62/8325* (2025.01); *H10P 52/402* (2026.01)

(58) Field of Classification Search
CPC ........................ H01L 21/304; H01L 21/02378
See application file for complete search history.

(56) References Cited

U.S. PATENT DOCUMENTS

2015/0361585 A1 12/2015 Aigo et al.
2018/0277635 A1* 9/2018 Wada ................... H10D 62/832
(Continued)

FOREIGN PATENT DOCUMENTS

JP 2016-139685 A 8/2016
WO 2014/196394 A1 12/2014

OTHER PUBLICATIONS

International Search Report for corresponding Application No. PCT/JP2021/042936, mailed Feb. 1, 2022.
(Continued)

*Primary Examiner* — Christine S. Kim
*Assistant Examiner* — Cole Leon Lindsey
(74) *Attorney, Agent, or Firm* — Renner, Otto, Boisselle & Sklar, LLP

(57) ABSTRACT

A silicon carbide substrate includes a first main surface, a second main surface, a threading screw dislocation, and a blind scratch. The second main surface is located opposite to the first main surface. The threading screw dislocation extends to each of the first main surface and the second main surface. The blind scratch is exposed at the first main surface and extends linearly as viewed in a direction perpendicular to the first main surface. A value obtained by dividing an area density of the blind scratch by an area density of threading screw dislocation is smaller than 0.13.

7 Claims, 14 Drawing Sheets

(56) References Cited

U.S. PATENT DOCUMENTS

| | | | |
|---|---|---|---|
| 2018/0363166 A1* | 12/2018 | Wada | .................... H01L 21/046 |
| 2019/0242014 A1* | 8/2019 | Kanbara | ................. C23C 16/42 |

OTHER PUBLICATIONS

Matsuhata, Hirofumi, Analysis of dislocation structure in 4H—SiC by synchrotron radiation topography, IEEJ Transactions on Fundamentals and Materials, The transactions of the Institute of Electrical Engineers of Japan. A., 2015. vol. 135. No. 12. pages 768-779 (see International Search Report (English translation) for corresponding Application No. PCT/JP2021/042936, mailed Feb. 1, 2022, submitted herewith, for concise explanation of relevance).

* cited by examiner

FIG.9

SILICON CARBIDE SUBSTRATE AND METHOD OF MANUFACTURING SILICON CARBIDE SUBSTRATE

TECHNICAL FIELD

The present disclosure relates to a silicon carbide substrate and a method of manufacturing the silicon carbide substrate. This application claims priority based on Japanese Patent Application No. 2021-039845 filed on Mar. 12, 2021. The entire contents of the Japanese patent application are incorporated herein by reference.

BACKGROUND ART

Japanese Unexamined Patent Application Publication No. 2016-139685 (PTL 1) describes a single-crystal silicon carbide substrate having a roughness Ra of 1 nm or less and having blind scratches.

CITATION LIST

Patent Literature

PTL 1: Japanese Unexamined Patent Application Publication No. 2016-139685

SUMMARY OF INVENTION

A silicon carbide substrate according to an embodiment of the present disclosure includes a first main surface, a second main surface, a threading screw dislocation, and a blind scratch. The second main surface is located opposite to the first main surface. The threading screw dislocation extends to each of the first main surface and the second main surface. The blind scratch is exposed at the first main surface and extends linearly as viewed in a direction perpendicular to the first main surface, A value obtained by dividing an area density of the blind scratch by an area density of the threading screw dislocation is smaller than 0.13.

A method of manufacturing a silicon carbide substrate according to an embodiment of the present disclosure includes the following steps. A silicon carbide single-crystal substrate is prepared. Chemical mechanical polishing is performed on the silicon carbide single-crystal substrate using colloidal silica as abrasive grains. When a grain size at which a cumulative value of a grain size distribution of the colloidal silica corresponds to 10% is a first grain size, a grain size at which the cumulative value of the grain size distribution of the colloidal silica corresponds to 50% is a second grain size, and a grain size at which the cumulative value of the grain size distribution of the colloidal silica corresponds to 90% is a third grain size, the first grain size is 20 nm to 40 nm, the second grain size is 1.2 times or more the first grain size, and the third grain size is 0.85 times to 1.15 times a sum of the first grain size and the second grain size.

BRIEF DESCRIPTION OF DRAWINGS

FIG. 9 is a schematic diagram showing a configuration of a mirror electron microscope.

DETAILED DESCRIPTION

Figure 1:
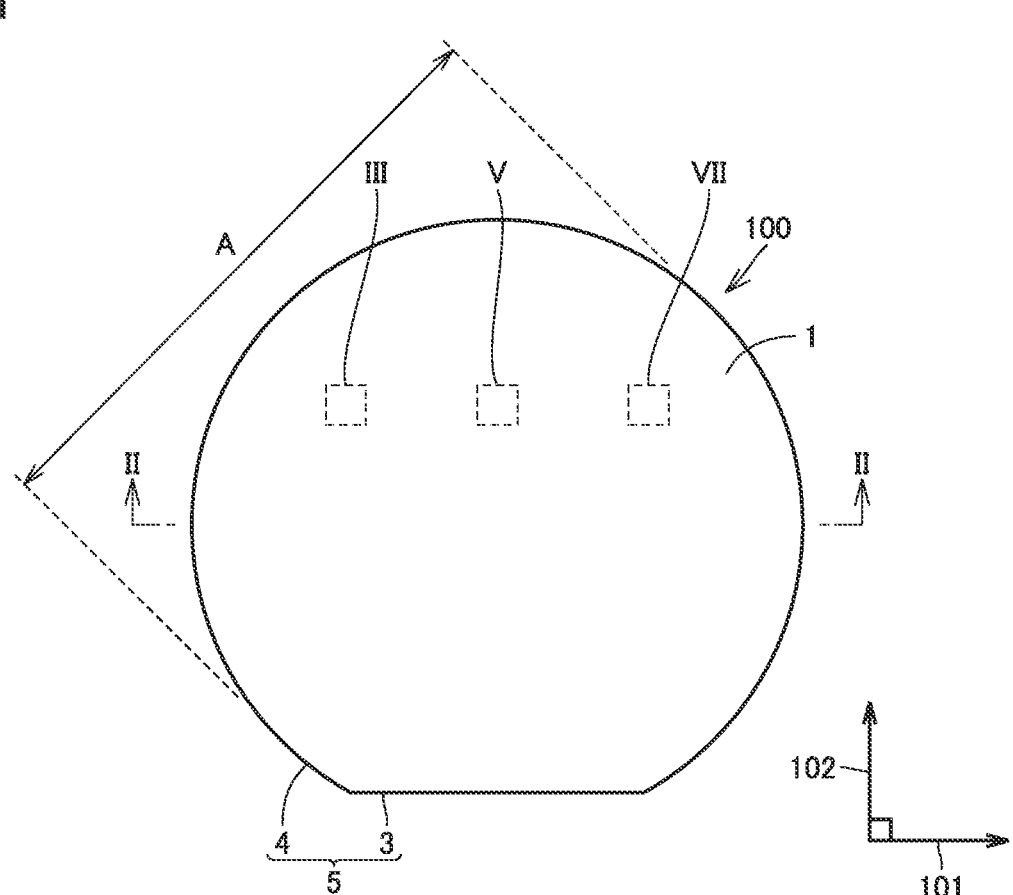
FIG. 1 is a schematic plan view showing the configuration of a silicon carbide substrate according to an embodiment of the present disclosure.

Problem to be Solved by the Present Disclosure

It is an object of the present disclosure to provide a silicon carbide substrate and a method of manufacturing a silicon carbide substrate that can inhibit the generation of carrot defects in a silicon carbide epitaxial layer.

Advantageous Effects of the Present Disclosure

According to the present disclosure, it is possible to provide a silicon carbide substrate and a method of manufacturing a silicon carbide substrate that can inhibit the generation of carrot defects in a silicon carbide epitaxial layer.

DESCRIPTION OF EMBODIMENTS (1) A silicon carbide substrate 100 according to an embodiment of the present disclosure includes a first main surface 1, a second main surface 2, a threading screw dislocation 21, and a blind scratch 30. Second main surface 2 is located opposite to first main surface 1. Threading screw dislocation 21 extends to each of first main surface 1 and second main surface 2. Blind scratch 30 is exposed at first main surface 1 and extends linearly as viewed in a direction perpendicular to first main surface 1. A value obtained by dividing an area density of blind scratch 30 by an area density of threading screw dislocation 21 is smaller than 0.13.

(2) In silicon carbide substrate 100 according to (1), the area density of blind scratch 30 may be determined using a mirror electron microscope while first main surface 1 is irradiated with an ultraviolet ray, and the area density of threading screw dislocation 21 may be determined using molten potassium hydroxide. The area density of blind scratch 30 may be determined under a condition that an interval between measurement regions 50 in first main surface 1 measured with the mirror electron microscope is 614 μm, and measurement regions 50 each have a square shape with each side of 80 mm.

(3) in silicon carbide substrate 100 according to (1) or (2), the area density of threading screw dislocation 21 may be 1,000/cm$^2$ or less.

(4) In silicon carbide substrate 100 according to (3), the area density of threading screw dislocation 21 may be 500/cm$^2$ or less.

(5) In silicon carbide substrate 100 according to any one of (1) to (4), the area density of blind scratch 30 may be 60/cm$^2$ or less.

(6) A method of manufacturing a silicon carbide substrate 100 according to an embodiment of the present disclosure includes the following steps. A silicon carbide single-crystal substrate 110 is prepared. Chemical mechanical polishing is performed on silicon carbide single-crystal substrate 110 using colloidal silica as abrasive grains 312, When a grain size at which a cumulative value of a grain size distribution of the colloidal silica corresponds to 10% is a first grain size, a grain size at which the cumulative value of the grain size distribution of the colloidal silica corresponds to 50% is a second grain size, and a grain size at which the cumulative value of the grain size distribution of the colloidal silica corresponds to 90% is a third grain size, the first grain size is 20 nm to 40 nm, the second grain size is 1.2 times or more the first grain size, and the third grain size is 0.85 times to 1.15 times a sum of the first grain size and the second grain size.

(7) In the method of manufacturing silicon carbide substrate 100 according to (6) above, in the performing chemical mechanical polishing on silicon carbide single-crystal substrate 110 using colloidal silica as abrasive grains 312, silicon carbide single-crystal substrate 110 may be vacuum-suctioned to a polishing head 302 with a cushioning member 303 between silicon carbide single-crystal substrate 110 and polishing head 302. A value obtained by multiplying a Shore A hardness of cushioning member 303 by a compression ratio of cushioning member 303 may be 1,000 degree-% or more.

DETAILS OF EMBODIMENTS OF PRESENT DISCLOSURE

Hereinafter, embodiments of the present disclosure will be described with reference to the drawings. In the following drawings, the same or corresponding portions are denoted by the same reference numerals, and description thereof will not be repeated. Regarding crystallographic indications in the present specification, an individual orientation is represented by [ ], a group orientation is represented by < >, an individual plane is represented by ( ) and a group plane is represented by { }. Generally, a negative index is supposed to be crystallographically indicated by putting "–" (bar) above a numeral but is indicated by putting the negative sign before the numeral in the present specification.

Figure 2:
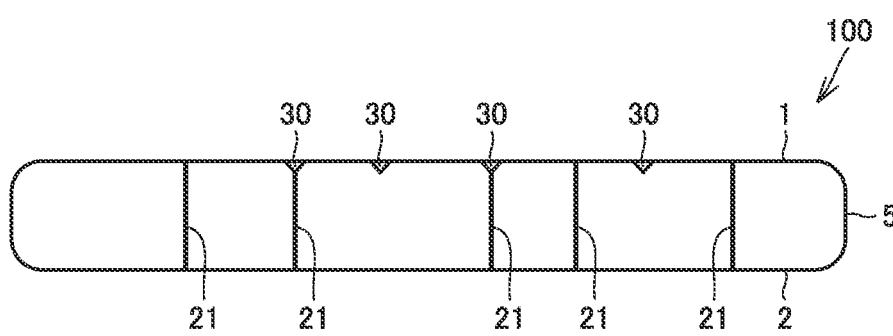
FIG. 2 is a schematic cross-sectional view taken along line II-II of FIG. 1.

First, a configuration of silicon carbide substrate 100 according to an embodiment of the present disclosure will be described. FIG. 1 is a schematic plan view showing the configuration of silicon carbide substrate 100 according to an embodiment of the present disclosure. FIG. 2 is a schematic cross-sectional view taken along line II-II of FIG. 1.

As shown in FIGS. 1 and 2, silicon carbide substrate 100 according to an embodiment of the present disclosure mainly has first main surface 1, second main surface 2, and an outer peripheral surface 5. As shown in FIG. 2, second main surface 2 is located opposite to first main surface 1.

Outer peripheral surface 5 extends to each of first main surface 1 and second main surface 2. Silicon carbide substrate 100 is composed of silicon carbide of polytype 4H. Silicon carbide substrate 100 contains an n-type impurity such as nitrogen (N). The conductivity type of silicon carbide substrate 100 is, for example, n-type. The concentration of the n-type impurity contained in silicon carbide substrate 100 is $1\times10^{17}$ cm$^{-3}$ to $1\times10^{20}$ cm$^{-3}$, for example.

As shown in FIG. 1, a maximum diameter A of first main surface 1 is, for example, 150 mm or more (6 inches or more). The maximum diameter A of first main surface 1 may be, for example, 200 mm or more (8 inches or more), In this specification, 6 inches refers to 150 mm or 152.4 mm (25.4 mm×6). 8 inches refers to 200 mm or 203.2 mm (25.4 mm×8). The maximum diameter A of first main surface 1 is the maximum distance between any two points on outer peripheral surface 5 as viewed in a direction perpendicular to first main surface 1.

First main surface 1 is a surface inclined at an off angle of more than 0° and 8° or less with respect to the {0001} plane, for example. The off angle may be, for example, 1° or more, or 2° or more. The off angle may be 7° or less or may be 6° or less. Specifically, first main surface 1 may be a surface inclined at an off angle more than 0° and 8° or less with respect to the (0001) plane. First main surface 1 may be a surface inclined at an off angle of more than 0° and 8° or less with respect to the (000-1) plane. The inclination direction (off direction) of first main surface 1 is, for example, a first direction 101.

As shown in FIG. 1, outer peripheral surface 5 may comprise, for example, an orientation flat 3 and an arc-shaped portion 4. Orientation flat 3 extends along first direction 101, for example. Arc-shaped portion 4 extends to orientation flat 3. As shown in FIG. 1, as viewed in a direction perpendicular to first main surface 1, first main surface 1 extends along each of first direction 101 and a second direction 102. As viewed in a direction perpendicular to first main surface 1, first direction 101 is a direction perpendicular to second direction 102.

First direction 101 is, for example, the <11-20> direction. First direction 101 may be, for example, the [11-20] direction, First direction 101 may be a direction obtained by projecting the <11-20> direction onto first main surface 1. From another viewpoint, first direction 101 may be, for example, the direction including the <11-20> direction component.

Second direction 102 is, for example, the <1-100> direction. Second direction 102 may be, for example, the [1-100] direction. Second direction 102 may be a direction obtained by projecting the <1-100> direction onto first main surface 1, for example. From another viewpoint, second direction 102 may be, for example, the <1-100> direction including a direction component.

First main surface 1 is, for example, an epitaxial layer formation surface, From another viewpoint, a silicon carbide epitaxial layer (not shown) is provided on first main surface 1. Second main surface 2 is, for example, a drain electrode formation surface. In other words, a drain electrode (not shown) of a MOSFET (Metal Oxide Semiconductor Field Effect Transistor) is formed on second main surface 2.

As shown in MG. 2, silicon carbide substrate 100 has threading screw dislocations 21. Threading screw dislocations 21 extend to each of first main surface 1 and second main surface 2. Threading screw dislocations 21 are exposed at each of first main surface 1 and second main surface 2. Threading screw dislocations 21 extend inside silicon carbide substrate 100 continuously from second main surface 2 to first main surface 1. As shown in FIG. 2, silicon carbide substrate 100 has blind scratches 30 located on first main surface 1.

Figure 3:
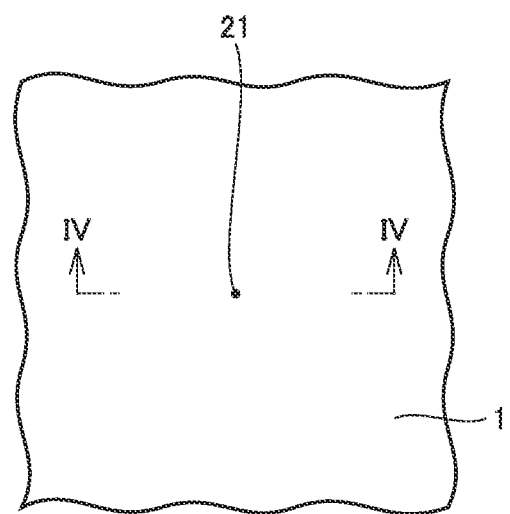
FIG. 3 is an enlarged plan view of region III of FIG. 1.

FIG. 3 is an enlarged plan view of region III of FIG. 1. As shown in FIG. 3, threading screw dislocation 21 is exposed at first main surface 1. As viewed in a direction perpendicular to first main surface 1, the shape of threading screw dislocation 21 is point-like.

Figure 4:
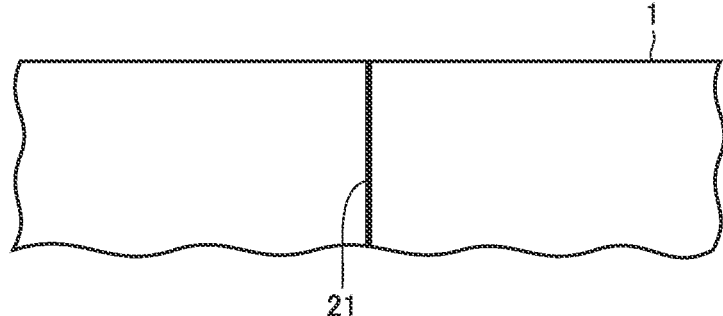
FIG. 4 is a schematic cross-sectional view taken along line IV-IV of FIG. 3.

FIG. 4 is a schematic cross-sectional view taken along line IV-IV of FIG. 3. The cross section shown in FIG. 4 is perpendicular to first main surface 1 and parallel to first direction 101. As shown in FIG. 4, threading screw dislocation 21 extends along a direction substantially perpendicular to first main surface 1. Threading screw dislocation 21 may extend along a direction perpendicular to the basal plane.

Figure 5:
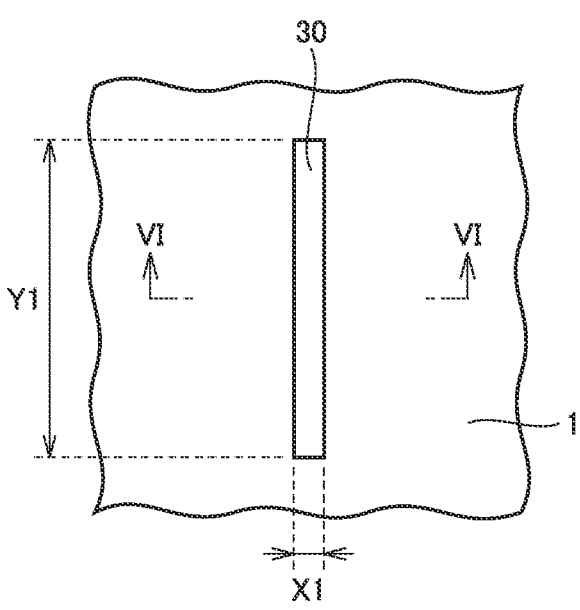
FIG. 5 is an enlarged plan view of region V of FIG. 1.

FIG. 5 is an enlarged plan view of region V of FIG. 1. As shown in FIG. 5, silicon carbide substrate 100 has blind scratch 30. Blind scratch 30 is a polishing damage formed on silicon carbide substrate 100 during the polishing. In blind scratch 30, the silicon carbide crystal is distorted. Blind scratch 30 is exposed at first main surface 1. As shown in FIG. 5, blind scratch 30 extends linearly as viewed in a direction perpendicular to first main surface 1. In other words, as viewed in a direction perpendicular to first main surface 1, blind scratch 30 has a linear shape. The linear shape may be a straight line shape or a curved line shape. As viewed in a direction perpendicular to first main surface 1, the length of blind scratch 30 in the longitudinal direction (a first length Y1) is, for example, 10 μm or more. When the blind scratch is a curved line shape, the length of the blind scratch in the longitudinal direction (first length Y1) is a length obtained by extending the curved blind scratch into a straight line. The direction in which blind scratch 30 extends may be first direction 101, may be second direction 102, or may be a direction inclined with respect to each of first direction 101 and second direction 102. When blind scratch 30 is a curved line shape, the direction in which blind scratch 30 extends is a tangential direction of blind scratch 30. The direction in which blind scratch 30 extends is not particularly limited.

As viewed in the direction perpendicular to first main surface 1, the lower limit of the length of blind scratch 30 in the longitudinal direction (first length Y1) is not particularly limited, but may be, for example, five times or more or ten times or more the width of blind scratch 30 in the lateral direction (a first width X1). As viewed in the direction perpendicular to first main surface 1, the upper limit of the length of blind scratch 30 in the longitudinal direction (first length Y1) is not particularly limited, but may be, for example, 1000 times or less or 500 times or less the width of blind scratch 30 in the lateral direction (first width X1).

Figure 6:
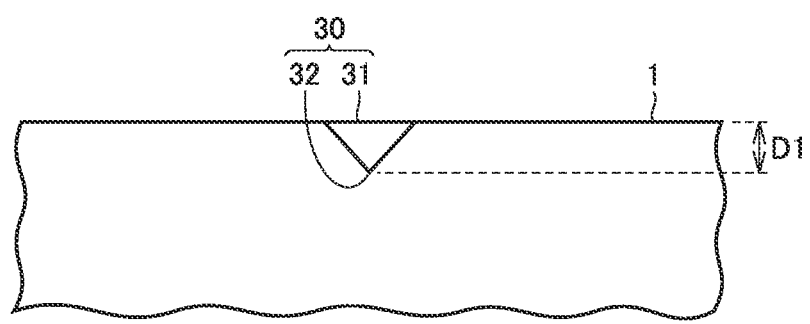
FIG. 6 is a schematic cross-sectional view taken along line VI-VI of FIG. 5.

FIG. 6 is a schematic cross-sectional view taken along line VI-VI of FIG. 5. The cross section shown in FIG. 6 is perpendicular to first main surface 1 and parallel to first direction 101. Blind scratch 30 has a bottom surface 32 and an upper surface 31. Bottom surface 32 extends to upper surface 31. First main surface 1 includes upper surface 31. Upper surface 31 constitutes a part of first main surface 1. Bottom surface 32 is located inside silicon carbide substrate 100. In a direction perpendicular to first main surface 1, bottom surface 32 may be located between first main surface 1 and second main surface 2, In cross-sectional view, bottom surface 32 may be, for example, V-shaped.

As shown in FIG. 6, the thickness of blind scratch 30 in a direction perpendicular to first main surface 1 is a first thickness D1. The lower limit of first thickness D1 is not particularly limited, and may be, for example, 0.1 nm or more or 1 nm or more. The upper limit of first thickness D1 is not particularly limited, and may be, for example, 100 nm or less or 10 nm or less.

Figure 7:
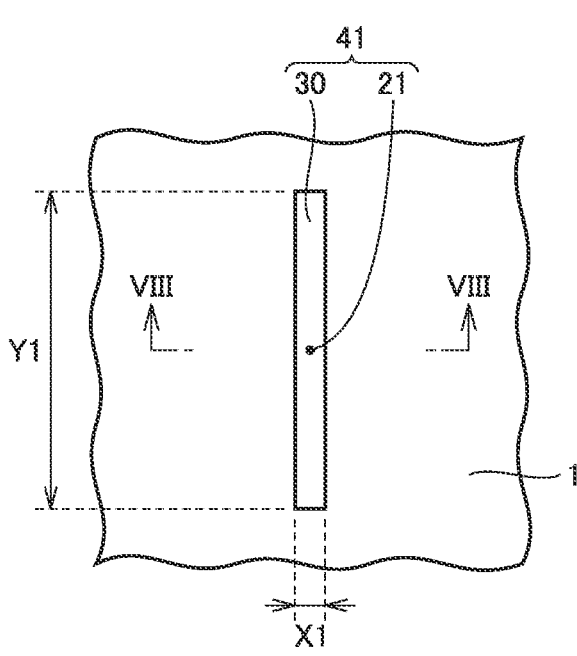
FIG. 7 is an enlarged plan view of region VII of FIG. 1.
Figure 8:
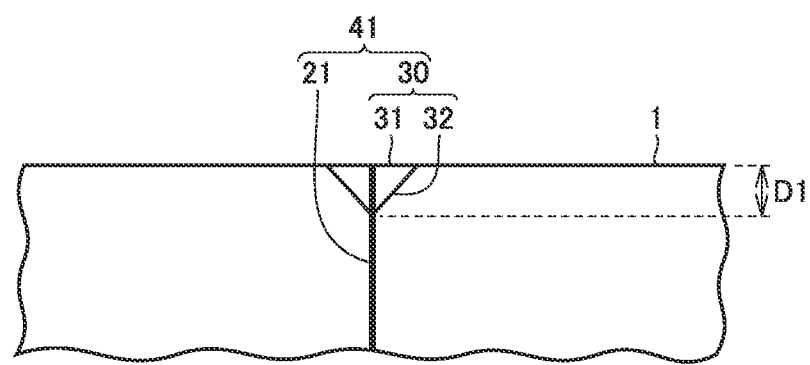
FIG. 8 is a schematic cross-sectional view taken along line VIII-VIII of FIG. 7.

FIG. 7 is an enlarged plan view of region VII of FIG. 1. FIG. 8 is a schematic cross-sectional view taken along line VIII-VIII of FIG. 7. The cross section shown in FIG. 8 is perpendicular to first main surface 1 and parallel to first direction 101. As shown in FIG. 8, threading screw dislocation 21 penetrates bottom surface 32 of blind scratch 30. Threading screw dislocation 21 is exposed at upper surface 31 of blind scratch 30. In other words, threading screw dislocation 21 is in contact with each of upper surface 31 and bottom surface 32. Threading screw dislocation 21 is stuck into blind scratch 30.

As shown in FIG. 7, blind scratch 30 into which threading screw dislocation 21 is stuck constitutes a first region 41. First region 41 constitutes a part of first main surface 1. First region 41 is composed of threading screw dislocation 21 exposed at first main surface 1 and upper surface 31 of blind scratch 30. As shown in FIG. 2, silicon carbide substrate 100 may have blind scratch 30 extends to threading screw dislocation 21 (first blind scratch) and blind scratch 30 spaced apart from threading screw dislocation 21 (second blind scratch).

As shown in FIG. 8, the majority of threading screw dislocation 21 is located outside blind scratch 30. As shown in FIG. 8, in the direction perpendicular to first main surface 1, the length of the portion of threading screw dislocation 21 located outside blind scratch 30 is longer than the length of the portion of threading screw dislocation 21 located inside blind scratch 30. As shown in FIG. 7, as viewed in a direction perpendicular to first main surface 1, the portion of threading screw dislocation 21 exposed at first main surface 1 may be surrounded by the outer edge of blind scratch 30.

Next, the area density of threading screw dislocation 21 will be described. The area density of threading screw dislocation 21 is determined using, for example, molten potassium hydroxide (KOH). Specifically, first main surface 1 of silicon carbide substrate 100 is etched by molten KOH. Thus, a silicon carbide region near threading screw dislocation 21 exposed at first main surface 1 is etched, whereby an etch pit is formed in first main surface 1. A value obtained by dividing the number of etch pits formed in first main surface 1 by the measurement area of first main surface 1 corresponds to the area density of threading screw dislocation 21 in first main surface 1. The temperature of the KOH melt is, for example, about 500 to 550° C. The etching time is about 5 to 10 minutes. After etching, first main surface 1 is observed using a Nomarski differential interference microscope.

When silicon carbide substrate 100 includes a threading edge dislocation and a basal plane dislocation in addition to threading screw dislocation 21, a silicon carbide region near the threading edge dislocation and the basal plane dislocation exposed at first main surface 1 is also etched. The originating etch pit in threading screw dislocation 21 is distinguished from each of the etch pit originating in the threading edge dislocation and the etch pit originating in the basal plane dislocation by the following method. The etch pit originating in the basal plane dislocation has an elliptical planar shape. The etch pit originating in the threading screw dislocation has a round or hexagonal planar shape and a large pit size. The etch pit originating in the through-edge dislocation has a round or hexagonal planar shape and a small pit size. In this evaluation method, the threading mixed dislocation is also evaluated as an etch pit similar to the threading screw dislocation, but the threading mixed dislocation is also included in the threading screw dislocation for evaluation.

In silicon carbide substrate 100 according to the embodiment of the present disclosure, the area density of threading screw dislocations 21 is, for example, 1,000/cm$^2$ or less. The upper limit of the area density of threading screw dislocation 21 is not particularly limited and may be, for example, 500/cm$^2$ or less or 450/cm$^2$ or less. The lower limit of the area density of threading screw dislocations 21 is not particularly limited, and may be, for example, 10/cm$^2$ or more, or 100/cm$^2$ or more.

Next, the area density of blind scratch 30 will be described. The area density of blind scratch 30 is determined by observing first main surface 1 with a mirror electron microscope. Details of the mirror electron microscope will be described later. Blind scratch 30 can be confirmed by a mirror electron microscope.

In silicon carbide substrate 100 according to the embodiment of the present disclosure, the area density of blind scratches 30 may be, for example, 60/cm$^2$ or less. The upper limit of the area density of blind scratches 30 is not particularly limited, and may be, for example, 54/cm$^2$ or less, or 48/cm$^2$ or less. The lower limit of the area density of blind scratches 30 is not particularly limited, and may be, for example, 0.1/cm$^2$ or more or 1/cm$^2$ or more.

In silicon carbide substrate 100 according to an embodiment of the present disclosure, a value obtained by diving the area density of blind scratch 30 by the area density of threading screw dislocation 21 is smaller than 0.13, The lower limit of the value obtained by dividing the area density of blind scratch 30 by the area density of threading screw dislocation 21 is not particularly limited, and may be, for example, 0.02 or more or 0.04 or more. The upper limit of the value obtained by dividing the area density of blind scratch 30 by the area density of threading screw dislocation 21 is not particularly limited, and may be, for example, 0.12 or less or 0.10 or less.

Figure 9:
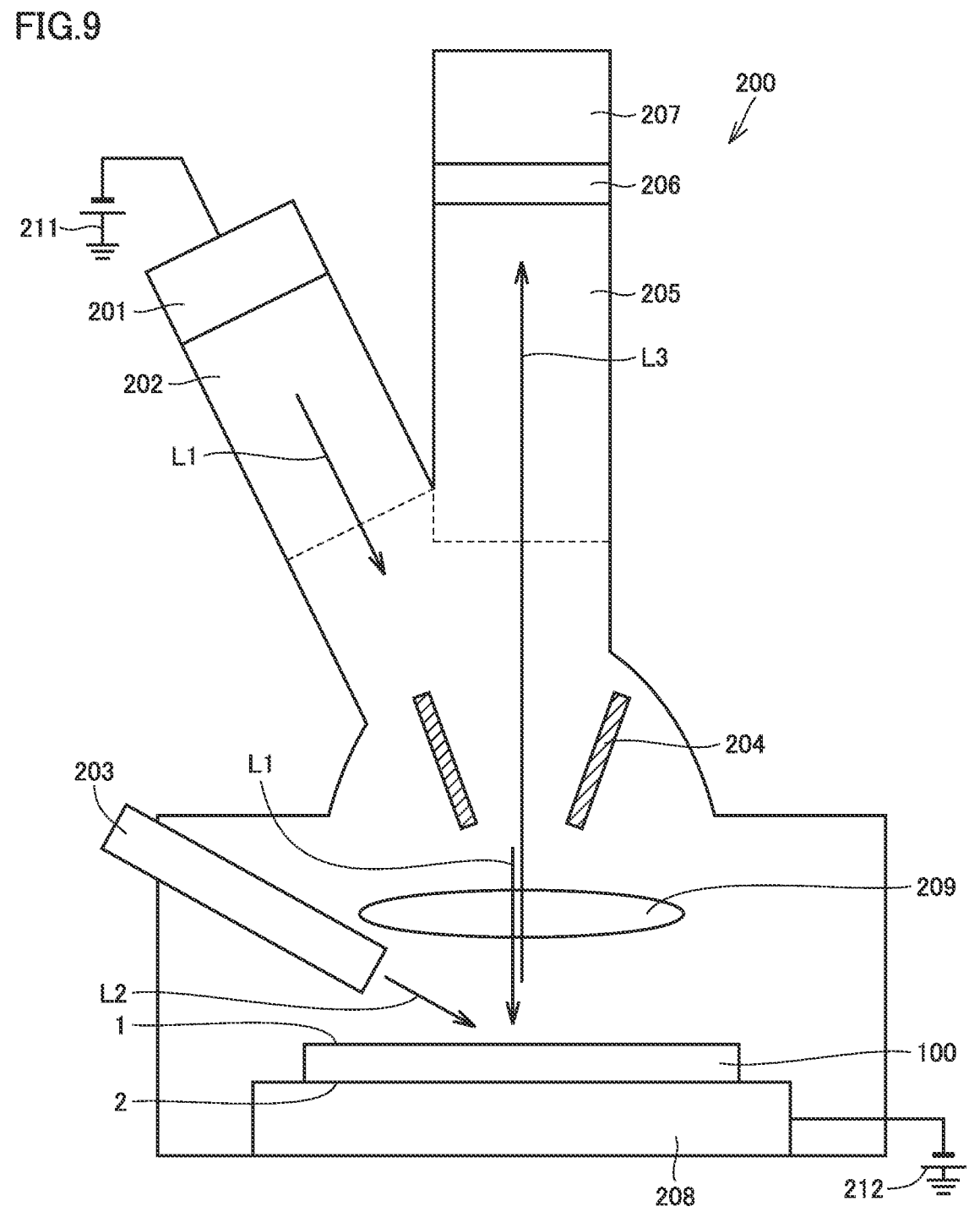

Next, a configuration of the mirror electron microscope will be described. FIG. 9 is a schematic diagram showing a configuration of a mirror electron microscope. As shown in FIG. 9, a mirror electron microscope 200 mainly includes a first power supply 211, an electron gun 201, a first electron lens 202, an ultraviolet irradiation unit 203, a separator 204, a second electron lens 205, a fluorescent screen 206, an imaging device 207, an electrostatic lens 209, a second power supply 212, and a substrate holding unit 208.

Electron gun 201 is an electron source that emits an electron beam. Electron gun 201 is connected to first power supply 211. An acceleration voltage is applied to electron gun 201 by first power supply 211. First electron lens 202 is disposed adjacent to electron gun 201. First electron lens 202 converges the electron beam. Silicon carbide substrate 100 is disposed on substrate holding unit 208. Electrostatic lens 209 is disposed above substrate holding unit 208.

The electron beam emitted by electron gun 201 passes through first electron lens 202 and electrostatic lens 209. Electrostatic lens 209 converts the electron beam converged by first electron lens 202 into a bundle of parallel electron beams. Thus, first main surface 1 of silicon carbide substrate 100 is irradiated with a bundle of parallel electron beams.

Substrate holding unit 208 is connected to second power supply 212. On first main surface 1 of silicon carbide substrate 100, a negative voltage substantially equal to the acceleration voltage of electron gun 201 is applied by second power supply 212. The irradiated electron beam is decelerated before reaching first main surface 1 of silicon carbide substrate 100. The electron beam is reversed in the vicinity of first main surface 1 without colliding with first main surface 1. Thereafter, it moves away from first main surface 1.

Second electron lens 205 is disposed between fluorescent screen 206 and separator 204. The electron beam returned from first main surface 1 passes through separator 204 and is directed to second electron lens 205. The electron beam is converged by second electron lens 205 and reaches fluorescent screen 206. Imaging device 207 captures an image formed on fluorescent screen 206 (mirror electron image). Separator 204 separates the optical path of the electron beam directed to silicon carbide substrate 100 from the optical path of the electron beam returned from silicon carbide substrate 100.

Ultraviolet irradiation unit 203 irradiates ultraviolet rays toward first main surface 1 of silicon carbide substrate 100. The irradiated ultraviolet rays have energy equal to or greater than the band gap of silicon carbide. The wavelengths of ultraviolet rays are, for example, 365 nm. When silicon carbide substrate 100 is irradiated with ultraviolet rays, blind scratch 30 is charged.

Next, a method of measuring the area density of blind scratch 30 will be described. The area density of blind scratch 30 is determined using mirror electron microscope 200. Mirror electron microscope 200 is, for example, a mirror electron inspection device (Mirelis VM1000) manufactured by Hitachi High-Tech Technology Corporation. First, silicon carbide substrate 100 is placed on substrate holding unit 208. Second main surface 2 of silicon carbide substrate 100 faces substrate holding unit 208. First main surface 1 of silicon carbide substrate 100 faces electrostatic lens 209.

The electron beam emitted by electron gun 201 passes through first electron lens 202, separator 204, and electrostatic lens 209, and is applied onto first main surface 1 of silicon carbide substrate 100. The acceleration voltage applied to electron gun 201 is, for example, 5 eV. The electron beam applied to first main surface 1 (an applied electron beam L1) is reversed in the vicinity of first main surface 1 without colliding with first main surface 1. The electron beam returned from first main surface 1 (a inverted electron beam L3) passes through separator 204, is converged by second electron lens 205, and reaches fluorescent screen 206. The image formed on fluorescent screen 206 (mirror electron image) is captured by imaging device 207.

Ultraviolet irradiation unit 203 applies ultraviolet rays L2 toward first main surface 1 of silicon carbide substrate 100, Blind scratch 30 is charged by the irradiation with ultraviolet rays L2. When the conductivity type of silicon carbide substrate 100 is an n-type, blind scratch 30 is negatively charged. In other words, blind scratch 30 is excited by ultraviolet rays L2.

When first main surface 1 is irradiated with ultraviolet rays L2 blind scratch 30 can be clearly specified. On the other hand, when first main surface 1 is not irradiated with ultraviolet rays L2, blind scratch 30 can hardly be identified.

Figure 10:
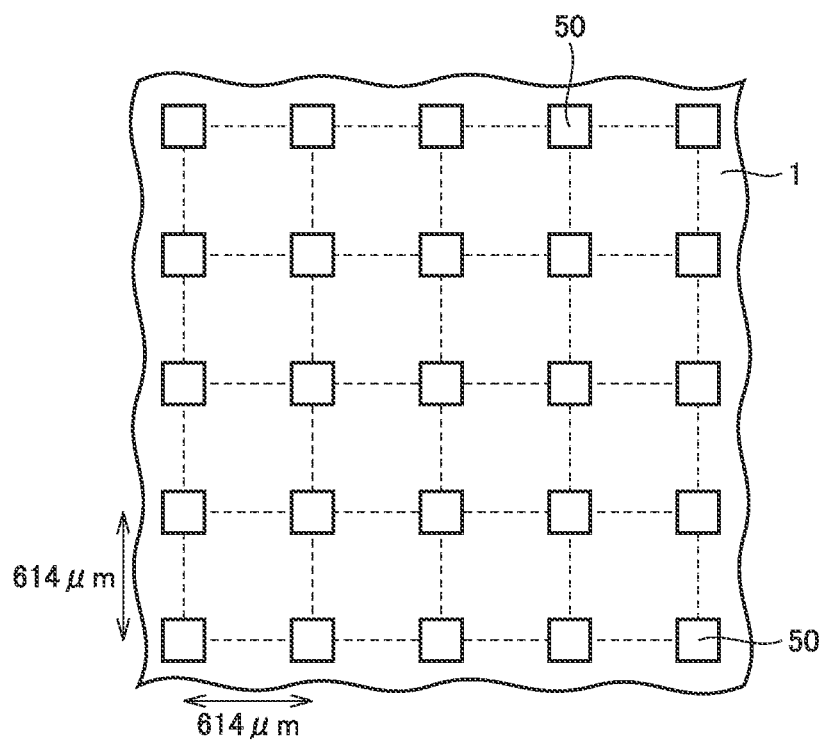
FIG. 10 is a schematic view showing a portion where a mirror electron image is captured.

FIG. 10 is a schematic view showing a portion where a mirror electron image is captured. By moving substrate holding unit 208 in a direction parallel to first main surface 1, a mirror electron image can be captured on entire first main surface 1 of silicon carbide substrate 100. As shown in FIG. 10, the position of measurement regions 50 of the mirror electron image is in a lattice pattern. Measurement regions 50 each have a round shape, for example. Measurement regions 50 each have a square shape with each side of 80 μm, for example. The interval between two adjacent measurement regions 50 is, for example, 614 μm. The maximum diameter of silicon carbide substrate 100 is, for example, 6 inches. Mirror electron images are captured at 37,952 locations on first main surface 1. As described above, the area density of blind scratch 30 may be determined under a condition that the interval between measurement regions 50 in first main surface 1 measured with mirror electron microscope 200 is 614 μm, and measurement regions 50 each have a square shape with each side of 80 μm.

Figure 11:
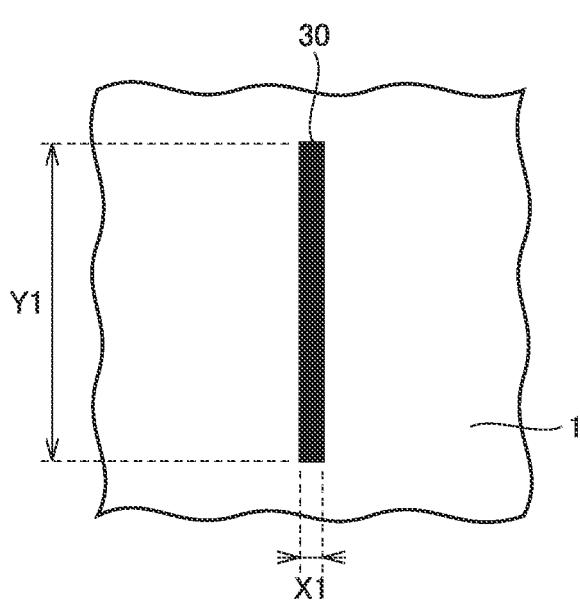
FIG. 11 is a schematic view showing a mirror electron image of a blind scratch.

FIG. 11 is a schematic view showing a mirror electron image of blind scratch 30, As shown in FIG. 11, the region of blind scratch 30 is displayed darker than the region around blind scratch 30. The region of blind scratch 30 is negatively charged, for example. In the vicinity of the negatively charged region, the equipotential surface bulges. The density of the electron beam decreases over blind scratch 30. As a result, in the mirror electron image, the region of blind scratch 30 is darker than the region around blind scratch 30.

As shown in FIG. 11, in the embodiment of the present disclosure, a region in which the width in the lateral direction (first width X1) was 0.5 μm to 5 μm, the length in the longitudinal direction (first length Y1) was 10 μm or more, and which was darker than the surrounding region was determined as blind scratch 30.

Figure 12:
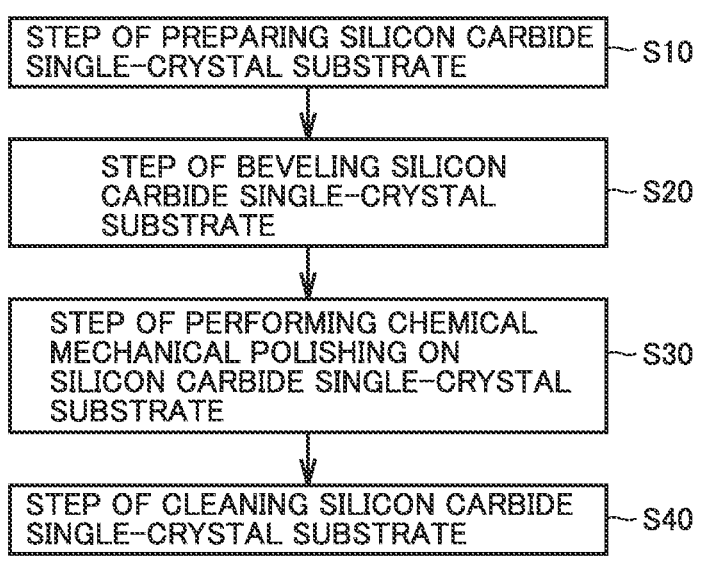
FIG. 12 is a flow diagram schematically showing a method of manufacturing a silicon carbide substrate according to an embodiment of the present disclosure.

Next, a method of manufacturing silicon carbide substrate 100 according to the embodiment of the present disclosure will be described. FIG. 12 is a flow diagram schematically showing a method of manufacturing silicon carbide substrate 100 according to an embodiment of the present disclosure.

As shown in FIG. 12, the method of manufacturing silicon carbide substrate 100 according to the embodiment of the present disclosure mainly includes a step (S10) of preparing silicon carbide single-crystal substrate 110, a step (S20) of beveling silicon carbide single-crystal substrate 110, a step (S30) of performing chemical mechanical polishing on silicon carbide single-crystal substrate 110, and a step (S40) of cleaning silicon carbide single-crystal substrate 110.

First, the step (S10) of preparing silicon carbide single-crystal substrate 110 is performed. Specifically, an ingot composed of a silicon carbide single crystal of polytype 4H is formed by the sublimation method, for example. After the ingot is shaped, the ingot is sliced by a wire saw device. Thus, silicon carbide single-crystal substrate 110 is cut out from the ingot.

Silicon carbide single-crystal substrate 110 is composed of hexagonal silicon carbide of polytype 4H. Silicon carbide single-crystal substrate 110 has first main surface 1 and second main surface 2 located opposite to first main surface 1. First main surface 1 is, for example, a plane off by 4° or less in the <11-20> direction with respect to the {0001} plane. Specifically, first main surface 1 is, for example, a plane off by an angle of about 4° or less with respect to the (0001) plane. Second main surface 2 is, for example, a plane off by an angle of about 4° or less with respect to the (000-1) plane.

Figure 13:
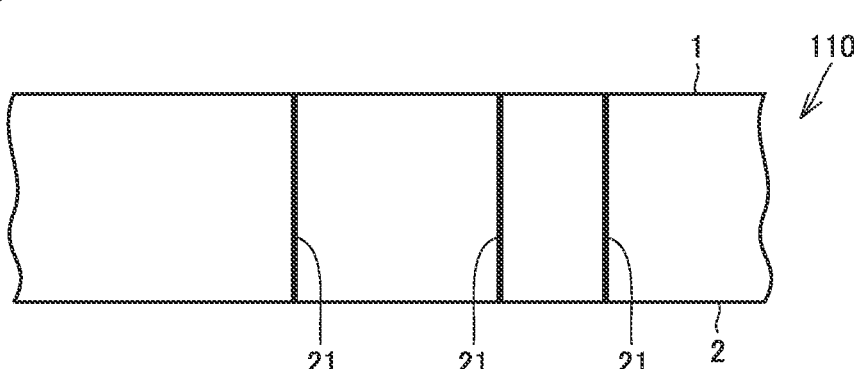
FIG. 13 is a schematic cross-sectional view showing preparing a silicon carbide single-crystal substrate.

FIG. 13 is a schematic cross-sectional view showing preparing silicon carbide single-crystal substrate 110. As shown in FIG. 13, silicon carbide single-crystal substrate 110 has first main surface 1, second main surface 2, and threading screw dislocations 21. Threading screw dislocations 21 extend to each of first main surface 1 and second main surface 2. Threading screw dislocations 21 extend continuously from second main surface 2 to first main surface 1.

Next, the step (S20) of beveling silicon carbide single-crystal substrate 110 is performed. Specifically, polishing is performed on outer peripheral surface 5 of silicon carbide single-crystal substrate 110. As a result, the corners of silicon carbide single-crystal substrate 110 are rounded. As a result, outer peripheral surface 5 of silicon carbide single-crystal substrate 110 is formed to protrude outward (see FIG. 2).

Next, rough polishing is performed on silicon carbide single-crystal substrate 110. Specifically, each of first main surface 1 and second main surface 2 is polished by the slurry. The slurry includes, for example, diamond abrasive grains. The diamond abrasive grains have a diameter of 1 μm to 3 μm, for example. Thus, rough polishing of silicon carbide single-crystal substrate 110 is performed on each of first main surface 1 and second main surface 2.

Next, the step (S30) of performing chemical mechanical polishing on silicon carbide single-crystal substrate 110 is performed. Specifically, chemical mechanical polishing is performed on silicon carbide single-crystal substrate 110 using a polishing liquid 310. Polishing liquid 310 contains, for example, abrasive grains 312 and an oxidizing agent 311. Abrasive grains 312 are, for example, colloidal silica. Oxidizing agent 311 is, for example, hydrogen peroxide solution, permanganate, nitrate, hypochlorite or the like. Polishing liquid 310 is, for example, DSC-0902 manufactured by Fujimi, Inc.

Figure 14:
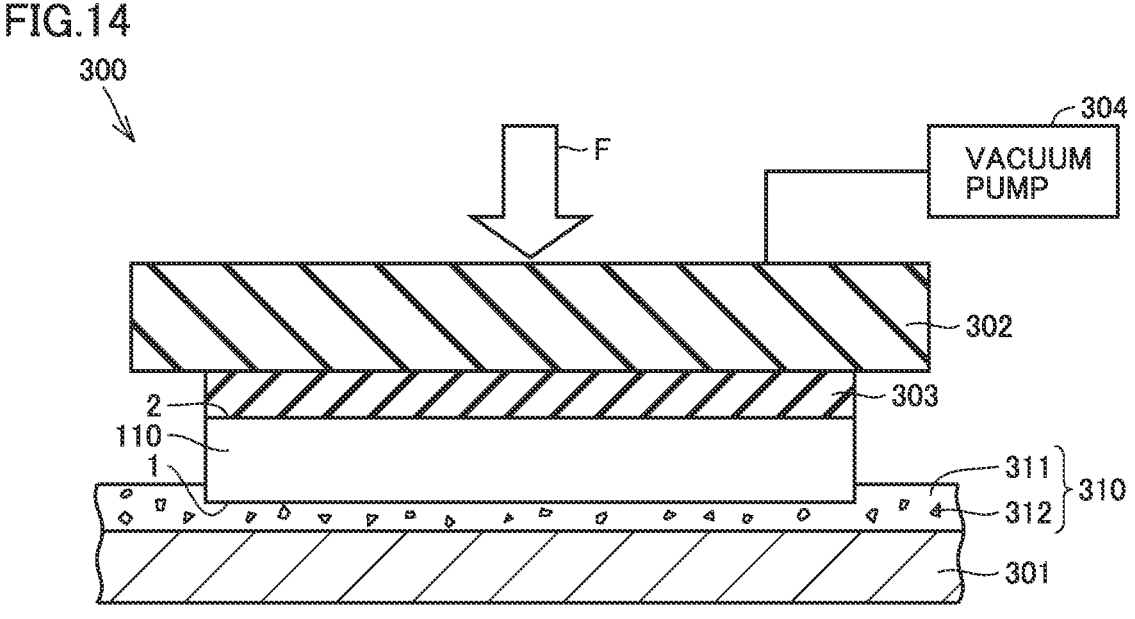
FIG. 14 is a schematic view showing performing chemical mechanical polishing on a silicon carbide single-crystal substrate.

FIG. 14 is a schematic view showing performing chemical mechanical polishing on silicon carbide single-crystal substrate 110. As shown in FIG. 14, a chemical mechanical polishing machine 300 includes a polishing cloth 301, polishing head 302, cushioning member 303, and a vacuum pump 304. Polishing cloth 301 is, for example, a nonwoven fabric manufactured by Nitta Haas (SUBA800) or a suede manufactured by Fujibo (G804 W), By using vacuum pump 304, silicon carbide single-crystal substrate 110 is vacuum-adsorbed to polishing head 302 with cushioning member 303 therebetween. Cushioning member 303 is disposed between polishing head 302 and silicon carbide single-crystal substrate 110. Polishing head 302 is made of, for example, ceramics or stainless steel. Chemical mechanical polishing is performed on silicon carbide single-crystal substrate 110 using colloidal silica as abrasive grains 312.

When a grain size at which a cumulative value of a grain size distribution of the colloidal silica corresponds to 10% is a first grain size ($D_{10}$), a grain size at which the cumulative value of the grain size distribution of the colloidal silica corresponds to 50% is a second grain size ($D_{50}$), and a grain size at which the cumulative value of the grain size distribution of the colloidal silica corresponds to 90% is a third grain size ($D_{90}$), the first grain size ($D_{10}$) is 20 nm to 40 nm, the second grain size ($D_{50}$) is 1.2 times or more the first grain size ($D_{10}$), and the third grain size ($D_{90}$) is 0.85 times to 1.15 times a sum of the first grain size ($D_{10}$) and the second grain size ($D_{50}$).

The lower limit of the first grain size ($D_{10}$) is not particularly limited and may be, for example, 22 nm or more, or 24 nm or more. The upper limit of the first grain size ($D_{10}$) is not particularly limited, and may be, for example, 38 nm or less, or 36 nm or less.

The lower limit of the second grain size ($D_{30}$) is not particularly limited, and may be, for example, 1.3 times or more or 1.35 times or more the first grain size ($D_{10}$). The upper limit of the second grain size ($D_{50}$) is not particularly limited, and may be, for example, 1.8 times or less or 1.5 times or less the first grain size ($D_{10}$).

The lower limit of the third grain size ($D_{90}$) is not particularly limited, and may be 0.9 times or more or 0.95 times or more a sum of the first grain size $D_{10}$ and the second grain size ($D_{50}$). The upper limit of the third grain size ($D_{90}$) is not particularly limited, and may be 1.1 times or less or 1.05 times or less a sum of the first grain size ($D_{10}$) and the second grain size ($D_{50}$).

Cushioning member 303 is made of a material having cushioning properties. Cushioning member 303 comprises, for example, polyurethane. More specifically, cushioning member 303 is, for example, polyurethane having a nap layer on its surface or a nonwoven fabric impregnated with polyurethane.

A value obtained by multiplying the Shore A hardness of cushioning member 303 by the compression ratio of cushioning member 303 is, for example, 1,000 degree-% or more. The lower limit of the value obtained by multiplying the Shore A hardness of cushioning member 303 by the compression ratio of cushioning member 303 is not particularly limited, and may be, for example, 1,100 degree % or more or 1,200 degree % or more. The upper limit of the value obtained by multiplying the Shore A hardness of cushioning member 303 by the compression ratio of cushioning member 303 is not particularly limited, and may be, for example, 1,700 degree-% or less or 1,600 degree % or more.

Next, a method of measuring the compression ratio of cushioning member 303 will be described. The compression ratio is measured according to JIIS1096 of the Japanese industrial Standard. The area of the pressing element is 50 mm$^2$. The compression ratio is obtained as $\{(T_0-T_1)/T_0\} \times 100$ (unit: %). Here, $T_0$ is the thickness of a sample when pressed at standard pressure (4.9 kPa), $T_1$ is the sample thickness when pressed at a constant pressure (29.4 kPa).

Next, a method of measuring the Shore A hardness of cushioning member 303 will be described. The Shore A hardness is measured according to JIS K7311 of the Japanese Industrial Standard. The measuring instrument for the Shore A hardness is in compliance with JIS K7215. The diameter of the compression element is 0.79 mm. The shape of the pressurizer is a truncated cone (35°). The amount of change in the sample thickness is read when 9.8 N is applied to the sample. The Shore A hardness ranges from 0 degrees to 100 degrees.

First main surface 1 of silicon carbide single-crystal substrate 110 is disposed to face polishing cloth 301. Polishing liquid 310 including abrasive grains 312 is supplied between first main surface 1 and polishing cloth 301. The rotation speed of polishing head 302 is, for example, 60 rpm. The rotation speed of the surface plate provided with polishing cloth 301 is, for example, 60 rpm. A processing surface pressure F is, for example, 500 g/cm$^2$.

Next, the step (S40) of cleaning silicon carbide single-crystal substrate 110 is performed. In the step (S40) of cleaning silicon carbide single-crystal substrate 110, silicon carbide single-crystal substrate 110 is cleaned with water. As described above, silicon carbide substrate 100 (see FIG. 1) is manufactured.

Next, operational effects of silicon carbide substrate 100 and the method of manufacturing silicon carbide substrate 100 according to the embodiment of the present disclosure will be described.

When threading screw dislocation 21 is present in silicon carbide substrate 100, carrot defects may be generated due to threading screw dislocation 21 when the silicon carbide epitaxial layer is formed on silicon carbide substrate 100. In addition, blind scratch 30 (polishing damage) may be generated on the main surface of silicon carbide substrate 100 by polishing. When blind scratch 30 is present on the main surface of silicon carbide substrate 100, the generation rate of carrot defects in the silicon carbide epitaxial layer is higher than when blind scratch 30 is not present on the main surface of silicon carbide substrate 100.

The present inventors have studied measures for suppressing the generation of blind scratch 30 in the chemical mechanical polishing step. The present inventors first focused on the grain size of colloidal silica. In order to achieve both a high polishing rate and low damage, it is conceivable to mix abrasive grains 312 having a large average grain size and abrasive grains 312 having a small average grain size. Abrasive grains 312 having a large average grain size increase the polishing rate, but cause large polishing damage to the main surface of silicon carbide substrate 100. Abrasive grains 312 having a smaller average grain size remove the polishing damage layer formed on the main surface by abrasive grains 312 having a larger average grain size. However, abrasive grain 312 having a small average grain size cannot completely remove the polishing damage layer formed on the main surface of silicon carbide substrate 100.

As a result of intensive studies, the inventors have made the grain size distribution of abrasive grain 312 broader than usual by mixing, for example, three or more kinds of colloidal silica having different average grain sizes. Specifically. When a grain size at which a cumulative value of a grain size distribution of the colloidal silica corresponds to 10% is a first grain size, a grain size at which the cumulative value of the grain size distribution of the colloidal silica corresponds to 50% is a second grain size, and a grain size at which the cumulative value of the grain size distribution of the colloidal silica corresponds to 90% is a third grain size, the first grain size is 20 nm to 40 nm, the second grain size is 1.2 times or more the first grain size, and the third grain size is 0.85 times to 1.15 times a sum of the first grain size and the second grain size. As a result, local damage to the main surface of silicon carbide substrate 100 can be removed. As a result, the generation of blind scratch 30 on the main surface can be suppressed. Therefore, when the silicon carbide epitaxial layer is formed on silicon carbide substrate 100, generation of carrot defects in the silicon carbide epitaxial layer can be suppressed.

The inventors have continuously studied measures for further reducing the generation rate of carrot defects. The inventors have paid attention to the arrangement of cushioning member 303 between silicon carbide substrate 100 and polishing head 302. First, cushioning member 303 having a high Shore A hardness was selected to prevent the flatness of silicon carbide substrate 100 from being deteriorated. In addition, by selecting cushioning member 303 having a low compression ratio, entire silicon carbide substrate 100 easily sinks toward polishing head 302. Since silicon carbide substrate 100 is easily moved in the pressure applying direction by cushioning member 303, it is possible to suppress a local increase in pressure on the polishing surface of silicon carbide substrate 100. As a result, the generation of blind scratch 30 on the main surface of silicon carbide substrate 100 can be suppressed.

In the method of manufacturing silicon carbide substrate 100 according to the embodiment of the present disclosure, a value obtained by multiplying the Shore A hardness of cushioning member 303 by the compression ratio of cushioning member 303 may be 1000 degree % or more. Thereby, it is possible to suppress the generation of blind scratch 30 in first main surface 1 of silicon carbide substrate

100 while suppressing the deterioration of the flatness of silicon carbide substrate 100. As a result, when the silicon carbide epitaxial layer is formed on silicon carbide substrate 100, the generation of carrot defects in the silicon carbide epitaxial layer can be further suppressed.

Example 1

(Sample Preparation)

First, silicon carbide substrates 100 according to samples 1 to 3 were prepared. Silicon carbide substrate 100 according to the sample 1 was taken as a comparative example. Silicon carbide substrates 100 according to the samples 2 and 3 were used as examples. When silicon carbide substrate 100 according to the sample 1 was manufactured, the colloidal grain size distribution in performing chemical mechanical polishing (S30) was adjusted as follows. To be specific, the first grain size ($D_{10}$) was defined as 31 nm, the second grain size ($D_{50}$) was defined as 44 nm, and the third grain size ($D_{90}$) was defined as 47 nm. On the other hand, when silicon carbide substrates 100 according to the samples 2 and 3 were manufactured, the colloidal grain size distribution in the step (S30) of performing chemical mechanical

50 was a square shape with a side of 80 μm. The interval between two adjacent measurement regions 50 was 614 μm. Mirror electron images were captured at 37,952 locations on first main surface 1. Next, threading screw dislocations 21 in first main surfaces 1 of silicon carbide substrates 100 according to the samples 1 to 3 were measured using molten KOH. The measurement method was as described above. Specifically, the temperature of the KOH melt was set to 525° C. The etching time was about 7.5 minutes. After etching, first main surface 1 was observed using a Normalski differential interference microscope. The magnification of the Nomarski differential interference microscope was 200 times.

Next, silicon carbide substrates 100 according to the samples 1 to 3 different from the samples used in the above measurement were prepared. Silicon carbide epitaxial layers were formed on first main surfaces 1 of silicon carbide substrates 100 according to the samples 1 to 3. After forming the silicon carbide epitaxial layer, the area density of carrot defects was measured on the surface of the silicon carbide epitaxial layer. The area density of carrot defects was measured with a WASAVI series "SICA 6X" manufactured by Lasertec Corporation.

(Evaluation Results)

TABLE 1

|  |  | Sample 1 | Sample 2 | Sample 3 |
|---|---|---|---|---|
| Condition of Chemical Mechanical Polishing | Grain Size Distribution of Colloidal Silica $D_{10}$ [nm] | 31 | 24 | 24 |
|  | $D_{50}$ [nm] | 44 | 33 | 33 |
|  | $D_{90}$ [nm] | 47 | 58 | 58 |
|  | Shore A Hardness of Cushioning Member [Degree] | None | None | 68 |
|  | Compression Ratio of Cushioning Member [%] | None | None | 22 |
| Mirror Electron Microscope | Area Density of Blind Scratch [/cm$^2$]: (1) | 70 | 52 | 40 |
| Etch Pit Method with Molten KOH | Area Density of TSD [/cm$^2$]: (2) | 442 | 428 | 435 |
| Ratio | (1)/(2) | 0.16 | 0.12 | 0.09 |
| Surface After Epitaxial Growth | Area Density of Carrot Defect [/cm$^2$] | 0.55 | 0.36 | 0.32 |
|  | Generation Rate of Carrot Defect with respect to TSD [%] | 0.13 | 0.08 | 0.07 | polishing was adjusted as follows, To be specific, the first grain size ($D_{10}$) was defined as 24 nm, the second grain size ($D_{50}$) was defined as 33 nm, and the third grain size ($D_{90}$) was defined as 58 nm.

When silicon carbide substrates 100 according to the samples 1 and 2 were manufactured, cushioning member 303 was not used in the step (S30) of performing chemical mechanical polishing. On the other hand, when silicon carbide substrate 100 according to the sample 3 was manufactured, cushioning member 303 was used in the step (S30) of performing chemical mechanical polishing. The Shore A hardness of cushioning member 303 was 68 degrees. The compression ratio of cushioning member 303 was 22%.

(Evaluation Method)

The area densities of blind scratch 30 on first main surfaces 1 of silicon carbide substrates 100 according to the samples 1 to 3 were measured using mirror electron microscope 200. The measurement method was as described above. To be specific, the area density of blind scratch 30 was measured using a mirror electronic inspection device (Mirelis VM1000) manufactured by Hitachi High-Tech Corporation. The wavelength of the ultraviolet rays was 365 nm. The positions of measurement regions 50 in the mirror electron image were in a lattice pattern. Measurement region As shown in Table 1, the area densities of blind scratches 30 on first main surfaces 1 of silicon carbide substrates 100 according to the samples 1 to 3 detected using mirror electron microscope 200 were 70/cm$^2$, 52/cm$^2$, and 40/cm$^2$, respectively. The area densities of threading screw dislocations 21 in first main surfaces 1 of silicon carbide substrates 100 according to the samples 1 to 3 detected using molten KOH were 442/cm$^2$, 428/cm$^2$, and 435/cm$^2$, respectively. In silicon carbide substrates 100 according to the samples 1 to 3, values (blind scratch ratios) obtained by dividing the area density of blind scratch 30 by the area density of threading screw dislocation 21 were 0.16, 0.12, and 0.09, respectively.

As shown in the above results, the blind scratch ratios in first main surfaces 1 of silicon carbide substrates 100 according to the samples 2 and 3 were smaller than the blind scratch ratio in first main surface 1 of silicon carbide substrate 100 according to the sample 1.

As shown in Table 1, the area densities of carrot defects in the surfaces of the silicon carbide epitaxial layers formed on first main surfaces 1 of silicon carbide substrates 100 according to the samples 1 to 3 were 0.55/cm$^2$, 0.36/cm$^2$, and 0.32/cm$^2$, respectively. Values obtained by dividing the area density of carrot defects in the surfaces of the silicon carbide epitaxial layers formed on first main surface 1 of silicon carbide substrates 100 according to the samples 1 to 3 by the area density of threading screw dislocation (TSD) in first main surface 1 (in other words, the generation rate of carrot defect with respect to TSD) were 0.13%, 0.08%, and 0.07%, respectively.

As shown in the above results, the area densities of carrot defects and the generation rates of carrot defect with respect to TSD on the surface of the silicon carbide epitaxial layers formed on first main surfaces 1 of silicon carbide substrates 100 according to the samples 2 and 3 were lower than the area density of carrot defects and the generation rate of carrot defect with respect to TSD on the surface of the silicon carbide epitaxial layer formed on first main surface 1 of silicon carbide substrate 100 according to the sample 1.

Example 21

(Sample Preparation)

Next, the influence of the Shore A hardness and compression ratio of cushioning member 303 on silicon carbide single-crystal substrate 110 was investigated. Cushioning members 303 according to samples 4 to 7 were prepared. Cushioning members 303 according to the samples 4 and 5 were examples. Cushioning members 303 of the samples 6 and 7 were comparative examples.

The Shore A hardness and the compression ratio of cushioning member 303 according to the sample 4 were 74 degrees and 15%, respectively. The Shore A hardness and compression ratio of cushioning member 303 according to Sample 5 were 68 degrees and 22%, respectively. The Shore A hardness and compression ratio of cushioning member 303 according to the sample 6 were 55 degrees and 18%, respectively. The Shore A hardness and the compression ratio of cushioning member 303 according to the sample 7 were 72 degrees and 4.2%, respectively. For cushioning members 303 according to the samples 4 and 5, the value obtained by multiplying the Shore A hardness by the compression ratio was 1,000 degree-% or more. For cushioning members 303 according to the samples 6 and 7, the value obtained by multiplying the Shore A hardness by the compression ratio was less than 1,000 degree-%.

(Evaluation Method)

Chemical mechanical polishing was performed on first main surface 1 of silicon carbide single-crystal substrate 110 using chemical mechanical polishing machine 300 shown in FIG. 14. The conditions for chemical mechanical polishing were as described above. After chemical mechanical polishing, the flatness of silicon carbide single-crystal substrate 110 (ITV) was measured. In addition, it was inspected whether damage remained in the threading dislocation portion existing in silicon carbide single-crystal substrate 110. When the flatness was good and no damage remained in the threading dislocation portion, the evaluation result was evaluated as OK. When the flatness was deteriorated, the evaluation result was evaluated as NG. When damage remained in the threading dislocation portion, the evaluation result was NG.

(Evaluation Results)

TABLE 2

| | Sample 4 | Sample 5 | Sample 6 | Sample 7 |
|---|---|---|---|---|
| Shore A Hardness of Cushioning Member [Degree] | 74 | 68 | 55 | 72 |

TABLE 2-continued

| | Sample 4 | Sample 5 | Sample 6 | Sample 7 |
|---|---|---|---|---|
| Compression Ratio of Cushioning Member [%] | 15 | 22 | 18 | 4.2 |
| Shore A Hardness × Compression Ratio [Degree %] | 1110 | 1496 | 990 | 302.4 |
| Evaluation Result | OK | OK | NG Flatness (TTV) Deteriorated | NG Damage Remained In Threading Dislocation Portion |

As shown in Table 2, when silicon carbide single-crystal substrates 110 were subjected to chemical mechanical polishing using cushioning members 303 according to each of the samples 6 and 7, the evaluation results of silicon carbide single-crystal substrates 110 after the chemical mechanical polishing were NG. On the other hand, when silicon carbide single-crystal substrates 110 were subjected to chemical mechanical polishing using cushioning members 303 according to the samples 4 and 5, the evaluation results of silicon carbide single-crystal substrates 110 after the chemical mechanical polishing were OK. As shown in the above results, it was confirmed that the deterioration of the flatness of silicon carbide single-crystal substrates 110 and the damage remaining in the threading dislocation portion can be suppressed by performing the chemical mechanical polishing using cushioning members 303 in which the value obtained by multiplying the Shore A hardness by the compression ratio is 1000 degree-% or more.

It should be understood that the embodiments and examples disclosed herein are illustrative in all respects and are not restrictive. The scope of the present invention is defined not by the above description but by the claims, and is intended to include meanings equivalent to the claims and all modifications within the scope.

REFERENCE SIGNS LIST

1 first main surface, 2 second main surface, 3 orientation flat, 4 arc-shaped portion, 5 outer peripheral surface, 21 threading screw dislocation, 30 blind scratch, 31 upper surface, 32 bottom surface, 41 first region, 50 measurement region, 100 silicon carbide substrate, 101 first direction, 102 second direction, 110 silicon carbide single-crystal substrate, 200 mirror electron microscope, 201 electron gun, 202 first electron lens, 203 ultraviolet irradiation unit, 204 separator, 205 second electron lens, 206 fluorescent screen, 207 imaging device, 208 substrate holding unit, 209 electrostatic lens, 211 first power supply, 212 second power supply, 300 chemical mechanical polishing machine, 301 polishing cloth, 302 polishing head, 303 cushioning member, 304 vacuum pump, 310 polishing liquid, 311 oxidizing agent, 312 abrasive grain, A maximum diameter, D1 first thickness, F processing surface pressure, L1 radiated electron beam, L2 ultraviolet rays, L3 inverted electron beam, X1 first width, Y1 first length.

The invention claimed is:

1. A silicon carbide substrate comprising:
   a first main surface;
   a second main surface located opposite to the first main surface;

a threading screw dislocation extending to each of the first main surface and the second main surface; and a blind scratch exposed at the first main surface and extending linearly as viewed in a direction perpendicular to the first main surface, wherein a value obtained by dividing an area density of the blind scratch by an area density of the threading screw dislocation is smaller than 0.13.

2. The silicon carbide substrate according to claim 1, wherein the area density of the blind scratch is determined using a mirror electron microscope while the first main surface is irradiated with an ultraviolet ray, and the area density of the threading screw dislocation is determined using molten potassium hydroxide, and the area density of the blind scratch is determined under a condition that an interval between measurement regions in the first main surface measured with the mirror electron microscope is 614 μm, and the measurement regions each have a square shape with each side of 80 μm.

3. The silicon carbide substrate according to claim 1, wherein the area density of the threading screw dislocation is 1,000/cm² or less.

4. The silicon carbide substrate according to claim 3, wherein the area density of the threading screw dislocation is 500/cm² or less.

5. The silicon carbide substrate according to claim 1, wherein the area density of the blind scratch is 60/cm² or less.

6. A method of manufacturing a silicon carbide substrate, the method comprising:

preparing a silicon carbide single-crystal substrate; and performing chemical mechanical polishing on the silicon carbide single-crystal substrate using colloidal silica as abrasive grains, wherein when a grain size at which a cumulative value of a grain size distribution of the colloidal silica corresponds to 10% is a first grain size, a grain size at which the cumulative value of the grain size distribution of the colloidal silica corresponds to 50% is a second grain size, and a grain size at which the cumulative value of the grain size distribution of the colloidal silica corresponds to 90% is a third grain size, the first grain size is 20 nm to 40 nm, the second grain size is 1.2 times or more the first grain size, and the third grain size is 0.85 times to 1.15 times a sum of the first grain size and the second grain size.

7. The method of manufacturing a silicon carbide substrate according to claim 6, wherein, in the performing chemical mechanical polishing on the silicon carbide single-crystal substrate using colloidal silica as abrasive grains, the silicon carbide single-crystal substrate is vacuum-suctioned to a polishing head with a cushioning member between the silicon carbide single-crystal substrate and the polishing head, and a value obtained by multiplying a Shore A hardness of the cushioning member by a compression ratio of the cushioning member is 1,000 degree % or more.

* * * * *